United States Patent
Lange et al.

(10) Patent No.: US 8,050,877 B2
(45) Date of Patent: Nov. 1, 2011

(54) METHOD FOR THE DETERMINATION OF WORK/POWER

(75) Inventors: Andreas Lange, Zang (DE); Rolf Hoffmann, Heidenheim (DE); Volker Weber, Heldenheim (DE); Bernhard Läng, Buerglen/TG (DE)

(73) Assignee: Voith Patent GmbH, Heidenheim (DE)

( * ) Notice: Subject to any disclaimer, the term of this patent is extended or adjusted under 35 U.S.C. 154(b) by 411 days.

(21) Appl. No.: 12/106,473

(22) Filed: Apr. 21, 2008

(65) Prior Publication Data
US 2009/0105972 A1    Apr. 23, 2009

(30) Foreign Application Priority Data
May 3, 2007   (DE) .......................... 10 2007 021 079

(51) Int. Cl.
*G01R 21/00*    (2006.01)
*G06F 19/00*    (2006.01)

(52) U.S. Cl. ....................................................... 702/60
(58) Field of Classification Search ............... 702/60, 702/64; 361/79, 86; 363/39, 97
See application file for complete search history.

(56) References Cited

U.S. PATENT DOCUMENTS

| | | | |
|---|---|---|---|
| 5,424,960 A * | 6/1995 | Watanabe et al. ............... 702/41 |
| 6,195,274 B1 | 2/2001 | Schroderus et al. |
| 6,304,472 B1 * | 10/2001 | Nagasu et al. .................. 363/97 |
| 7,082,374 B2 | 7/2006 | Ranta |
| 2002/0039299 A1 * | 4/2002 | Nishimura et al. ............. 363/39 |

FOREIGN PATENT DOCUMENTS

| | | |
|---|---|---|
| CA | 2 616 936 | 2/2007 |
| DE | 39 23 590 | 1/1991 |
| DE | 10 2005 036 317 | 2/2007 |
| EP | 1 215 503 | 6/2002 |

OTHER PUBLICATIONS

Foreign patent document with English language abstract.

* cited by examiner

*Primary Examiner* — Bryan Bui
(74) *Attorney, Agent, or Firm* — Baker & Daniels LLP

(57) ABSTRACT

A method for the determination of the electrical work in systems in which the voltage is switched. At preset times for this purpose current values are measured and interpolated between the measurement. With the help of the switched voltage a classification of each interpolated current path is performed. The interpolated current value is then multiplied or integrated by the voltage value/values between the preset times respectively for the determination of the work. Along with the electrical work moreover in accordance with a further method similarly the electrical power in such systems can be determined.

21 Claims, 4 Drawing Sheets

METHOD FOR THE DETERMINATION OF WORK/POWER

BACKGROUND

The invention relates to a method for the determination of the electrical work in systems in which the voltage is switched. In addition the invention relates to a method for the determination of the electrical power in systems in which the voltage is switched.

In the case of converter-fed electrical systems, in particular loads such as electrical motors or inductive components, such as for example transformers, chokes or the like, the required terminal voltage is typically built up by the application of a clocked switched direct-current voltage. So that this can happen in as loss-free a manner as possible, rapid switching processes are strived for. In order for example to obtain a sinusoidal voltage form within the scope of a pulse width modulation voltage time slots or voltage time pulses of different duration are created. Switching regulators or pulse width modulators are in the process established means for the generation of the voltage pulses.

For determination or measurement of power in such systems with switched voltages it has been necessary up to now to isochronously measure current and voltage precisely. In particular due to the typically very rapidly pulsed voltages this is connected with an extremely large technical expenditure. Along with the required installation space and the weight of such hardware, the extremely high costs also constitute a serious disadvantage.

SUMMARY

It is therefore the object of the invention to specify a method in which case the above named disadvantages can be avoided and in which case it is possible to determine simply and effectively the work or the power with high precision.

In the case of the method in accordance with the invention at preset times, which are typically asynchronous to the times at which the voltage is switched, current values are measured. Subsequently the current values are interpolated between the measurements. With the help of the switched voltage a classification of each interpolated current path is further performed. The interpolated current path is then multiplied or integrated by the voltage value/values between the preset times respectively for the determination of the work in the respective time interval. In the case of a known interval length in accordance with a further development of the invention the power can be determined quickly and easily in the respective interval.

In the case of a voltage pulse model with variable or unknown period, for example in the case of a current hysteresis regulator, it is not possible to specify an exact variation in time between the measured current values, since the current path can exhibit bends as a result of switching operations. The current path is thus in accordance with the invention approximated by means of an interpolation from value to value. In the process several different cases can occur, in which the interpolated current paths are classified. Such a class can for example be defined by the switching sequence of the voltage from 0 to the intermediate circuit voltage $U_{ZK}$; another one can be defined by the switching sequence $+U_{ZK}$, 0, $-U_{ZK}$ etc.

In the case of known or measured switching times and voltages there are for the interpolated path of the current now also the voltage slots known (or easy to measure) from the switching times and the intermediate circuit voltage, which can now be allocated to the respective approximate current-time paths at the desired time. Depending on the class then a different voltage curve arises and with it a different calculation of the individual work or power values.

In place of precise isochronously gained readings for current and voltage in accordance with the invention non-isochronous—or if need be through occasional coincidental matching of the measuring and switching times—isochronously measured voltage and current values and approximations of the current path lying in between can be used for determination of the electrical work.

According to a very favorable and advantageous further development of the invention through reference to the period between the individual current measurements from the work the power can be determined quickly and easily.

It turns out that that a determination of the work or power in accordance with the invention is quick and efficient and in the process furnishes high precision. Thus with a simple linear interpolation and the current measurements that are asynchronous to the switching points of the voltage in the method in accordance with the invention work values or power values are determined which deviate by significantly less than 2% from comparison values measured with conventional methods. The measuring and computational effort is in the process low, so that the determination of the work or of the power can be easily integrated into the control system of a converter and calculated in real time.

This method is in particular suitable also for power calculation in the control system of a frequency converter, for example for the motor of a travel drive.

In an especially favorable design of the method in accordance with the invention the preset times for current measurement are clocked in a tightly preset time interval.

The intervals for current measurement thus arising can then be preset especially easily and favorably with the help of the clock frequency of the computer used for the method. The cycle can in the process then also be used very easily for power determination from the work readings by means of dividing the work in the respective interval by the interval period.

The sampling frequency of the current should be greater than the switching frequency.

In accordance with a simple and especially efficient variant of the invention the interpolation of the current path between the measured values takes place in a linear manner.

This easiest and most rapid of all approximation methods furnishes very good values. The linear approximation supplies current-time trapezes which can be easily multiplied by the voltage time blocks in order to get the work in the interval. Integration and the computational effort connected with it can be dispensed with.

In an alternative design of the method the interpolation of the current path between the measured values takes place with an approximation polynomial, in particular an approximation polynomial of the $3^{rd}$ order.

With such an approximation via a polynomial, also called spline, a further improvement of the precision of the determined work or power values can be achieved with justifiable extra expenditure in computer power. Although the spline runs continuously and in particular also constantly in the measuring points whereas the real current path on the other hand exhibits bends, in spite of the mathematically incorrect simulation of the current behavior a very high precision of the approximated current values and with it also of the integrated work values and consequently ultimately of the power can be achieved.

BRIEF DESCRIPTION OF THE DRAWINGS

Further advantageous designs also arise from the remaining dependent claims and from the exemplary embodiments, which will be explained subsequently by way of example with the help of the figures.

The figures show the following.

DETAILED DESCRIPTION

The following examples explain the method in accordance with the invention with the help of all the classification cases. In the process essentially the linear interpolation serves as an example. Moreover only the amounts of the voltages are taken into consideration. A corresponding application to other interpolation methods and positive/negative voltage values can however be easily deduced in analogy.

Figure 1:
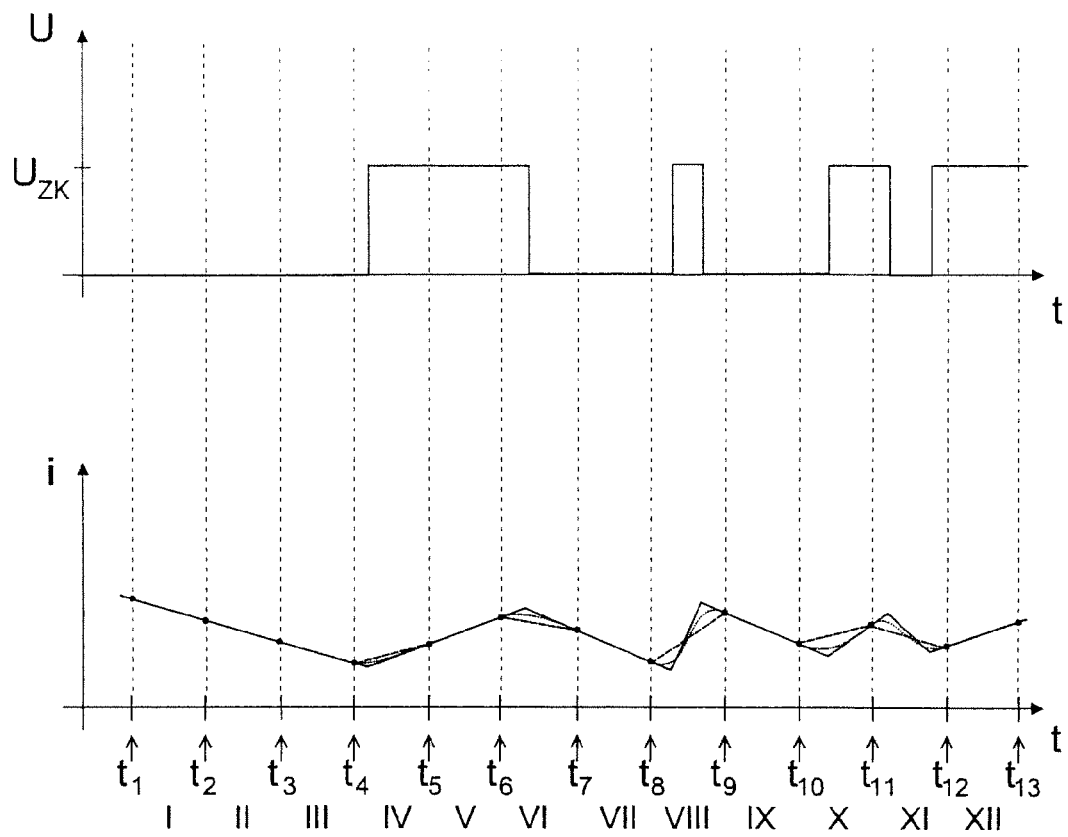
FIG. 1 diagrams with time history of current and voltage.

FIG. 1 shows in two diagrams with continuous lines the time history of a switched voltage U(t) and of a current i(t), as for example is generated by an analogous current regulator. It can be recognized that the switching operations of voltage U and the measurements of the current i do not take place synchronously. Up to now the voltages have had to be measured at the times of the measurement of the current.

According to the method explained here, now only the measurement of the current i(t) takes place at thirteen discrete times $t_1$ through $t_{13}$, which for example can be preset by the clock frequency of a computer. In the present case these times for twelve intervals which are numbered here using Roman numerals I through XII. The path of the current i(t) is approximated respectively by a linear interpolation between the individual measuring points $t_1$ through $t_{13}$. In the case of the real current path preset here with the continuous line in the intervals IV, VI, VIII, X and XI there are deviations of the linear interpolated current path, which is shown here in dashed lines, from the real current path i(t) represented in continuous lines.

In order to illustrate the above shown alternative with an approximation by a spline in addition such an approximation is shown in dotted lines. Here too only the above named intervals IV, VI, VIII, X and XI deviate from the real path.

In the diagrams of FIG. 1 it is now recognizable that it is a matter of distinguishing typically six different cases/classifications. One can link these in particular to the voltage U or its switching behavior. In the ideal case, for example in the case of a pulse width modulated voltage signal, in the process, the respective switching time as well as the amount $U_{ZK}$ of the intermediate circuit voltage is known. If necessary these values can however also be determined by a comparatively simple additional measurement.

In the process in the following explanations the determination of the work $W_n$ performed in the interval are to the fore. From this however the power in the interval can be determined by simply referring to the interval length. It would also be conceivable to total up the work (or also the power directly) over several intervals and then divide by the chronological length of the totaled intervals.

Figure 2:
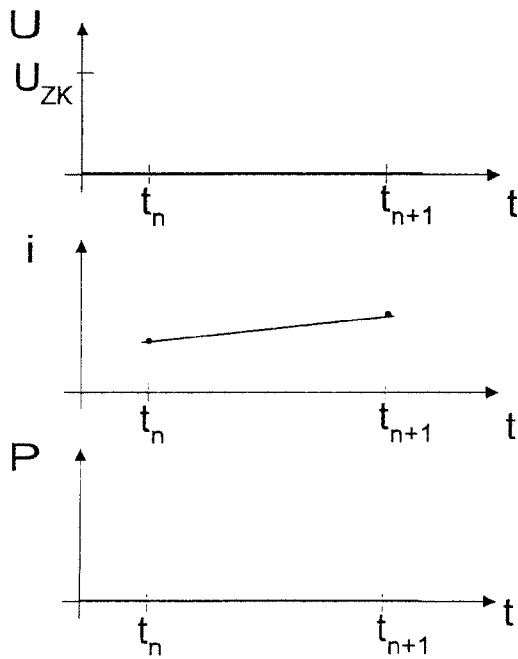
FIG. 2 diagrams with time history of current, voltage and power in accordance with a first case of classification.

A first class, as shown in FIG. 2, is characterized by the lack of voltage, thus by the voltage value 0. Also the work $W_n$—and with it here also the power itself—can be easily determined in the respective time interval of this class with:

$$W_n = 0 \quad (1)$$

Figure 3:
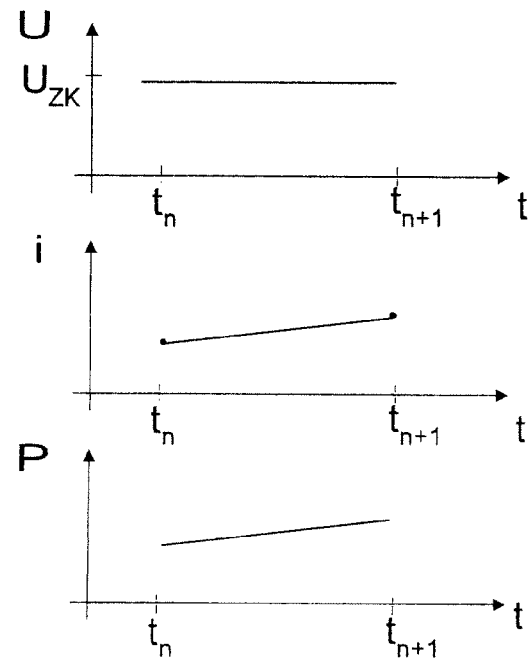
FIG. 3 diagrams with time history of current, voltage and power in accordance with a second case of classification.

A second class, as shown in FIG. 3, is characterized by the presence of a constant voltage $U_{ZK}$. Here the work $W_n$ in the interval can be easily determined as a surface under the power curve from a trapeze, which exhibits the full width of the interval:

$$W_n = \tfrac{1}{2} \cdot ((i(t_n) + i(t_{n+1})) \cdot (\pm U_{ZK}) \cdot (t_{n+1} - t_n) \quad (2)$$

Figure 4:
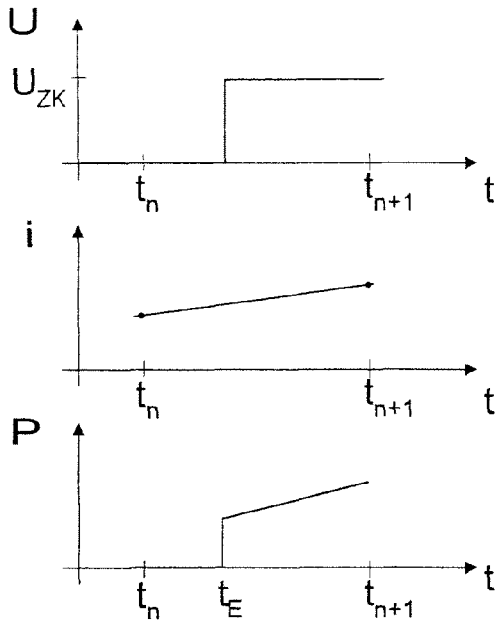
FIG. 4 diagrams with time history of current, voltage and power in accordance with a third case of classification.

A third class, as shown in FIG. 4, is characterized by a connection of the voltage at time $t_E$ from a value 0 to the intermediate circuit voltage $U_{ZK}$ in the interval. The work Wn is likewise determined here by a trapeze, which however comprises only a part of the width of the interval:

$$W_n = \tfrac{1}{2} \cdot ((i(t_E) + i(t_{n+1})) \cdot (\pm U_{ZK}) \cdot (t_{n+1} - t_E) \quad (3)$$

with $$i(t_E) = i(t_n) + (i(t_{n+1}) - i(t_n)) \cdot ((t_E - t_n)/(t_{n+1} - t_n)) \quad (3')$$

Figure 5:
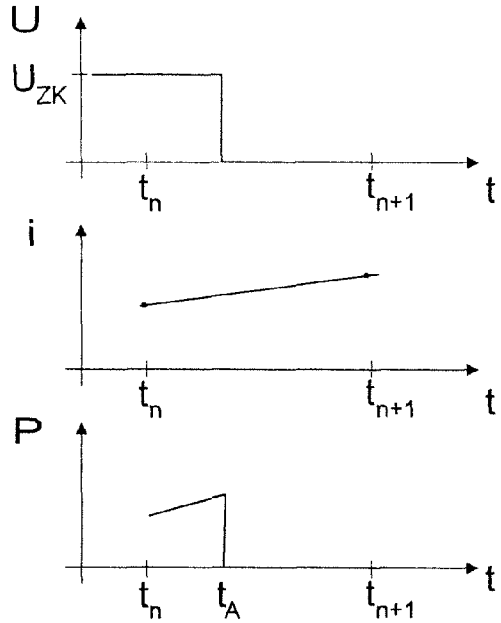
FIG. 5 diagrams with time history of current, voltage and power in accordance with a fourth case of classification.

A fourth class, as shown in FIG. 5, is characterized by a disconnection of the voltage at the time $t_A$ from the intermediate circuit voltage $U_{ZK}$ to a value 0 in the interval. The work $W_n$ is likewise determined here by a trapeze, which only comprises a part of the width of the interval:

$$W_n = \tfrac{1}{2} \cdot ((i(t_A) + i(t_n)) \cdot (\pm U_{ZK}) \cdot (t_A - t_n) \quad (4)$$

with $$i(t_A) = i(t_n) + (i(t_{n+1}) - i(t_n)) \cdot ((t_A - t_n)/(t_{n+1} - t_n)) \quad (4')$$

Figure 6:
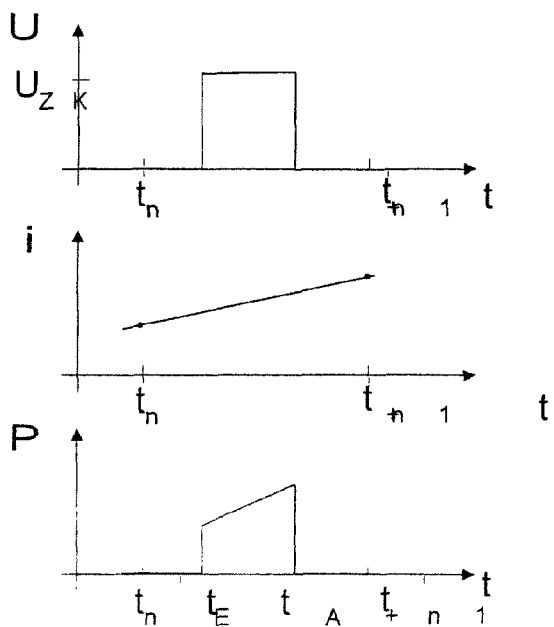
FIG. 6 diagrams with time history of current, voltage and power in accordance with a fifth case of classification.

A fifth class, as shown in FIG. 6, is characterized by a sequence of two switching operations in the interval. In the process first a connection of the voltage at time $t_E$ from a value 0 to the intermediate circuit voltage $U_{ZK}$ takes place and subsequently an disconnection of the voltage at time $t_A$ from the intermediate circuit value $U_{ZK}$ to a value 0. The work $W_n$ is likewise determined here by a trapeze, which comprises only a part of the width of the interval $$W_n = \tfrac{1}{2} \cdot ((i(t_A) + i(t_E)) \cdot (\pm U_{ZK}) \cdot (t_A - t_E) \quad (5)$$

with $$i(t_A) = i(t_n) + (i(t_{n+1}) - i(t_n)) \cdot ((t_A - t_n)/(t_{n+1} - t_n)) \quad (5')$$

and $$i(t_E) = i(t_n) + (i(t_{n+1}) - i(t_n)) \cdot ((t_E - t_n)/(t_{n+1} - t_n)) \quad (5'')$$

Figure 7:
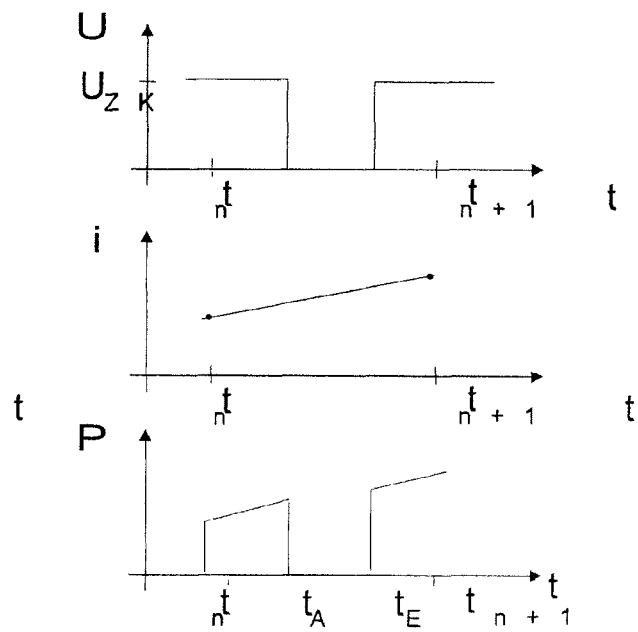
FIG. 7 diagrams with time history of current, voltage and power in accordance with a sixth case of classification.

A sixth and last possible class, as shown in FIG. 7, is likewise characterized by a sequence of two switching operations. These however take place in inverse order than in the preceding class. Thus first a disconnection of the voltage takes place at time $t_A$ from the intermediate circuit voltage $U_{ZK}$ to a value 0, then a connection of the voltage takes place at time $t_E$ from the value 0 to the intermediate circuit voltage $U_{ZK}$. The work $W_n$ is determined here by two trapezes which comprise respectively and in total only a part of the width of the interval:

$$W_n = 1/2 \cdot ((i(t_n)+i(t_A)) \cdot (\pm U_{ZK}) \cdot (t_A-t_n) + 1/2 \cdot ((i(t_E)+i(t_{n+1})) \cdot (\pm U_{ZK}) \cdot (t_{n+1}-t_E) \qquad (6)$$

with $$i(t_A)=i(t_n)+(i(t_{n+1})-i(t_n)) \cdot ((t_A-t_n)/(t_{n+1}-t_n)) \qquad (6')$$

and $$i(t_E)=i(t_n)+(i(t_{n+1})-i(t_n)) \cdot ((t_E-t_n)/(t_{n+1}-t_n)) \qquad (6'')$$

The slope of the current paths shown here positively by way of example can of course actually turn out to be both positive as well as negative in the individual intervals. If one used for example a spline in place of the linear interpolation, for determination of the work $W_n$ the surface under the interpolated power curve must be integrated into each of the classes somewhat more elaborately.

Further the six classes can also be reduced to three generalized classes. For this it is sufficient to classify the three new classes by the number of switching operations taking place in the interval. Additionally one then requires a k factor, which depending on the switching state assumes the values $$k=-1; 0; +1$$

In place of the "real" signed value of the initial voltage $U_A$, which is indicated above by the symbol $\pm U_{ZK}$, here—due to the signed value k—the amount of the intermediate circuit voltage $|\pm U_{ZK}|$ is sufficient for calculation.

If one follows this solution, one obtains three formulas in order to determine in the respective interval the work $W_n$ for all conceivable classes.

Figure 8:
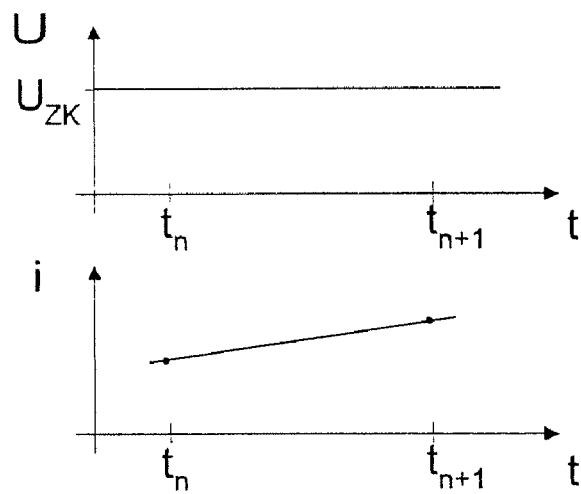
FIG. 8 diagrams with time history of current, voltage and power in accordance with a first combination case of classifications.

The first class, as can be recognized in FIG. 8, is defined by the fact that no switching operation takes place. The work $W_n$ (in FIGS. 8-10 no longer explicitly represented) is determined similar to the above made statements as a simple trapeze over the entire width of the interval by:

$$W_n = 1/2 \cdot ((i(t_n)+i(t_{n+1})) \cdot |U_{ZK}| \cdot (t_{n+1}-t_n) \cdot k \qquad (A)$$

With $k=-1; 0; +1$, depending on the state of the voltage.

Figure 9:
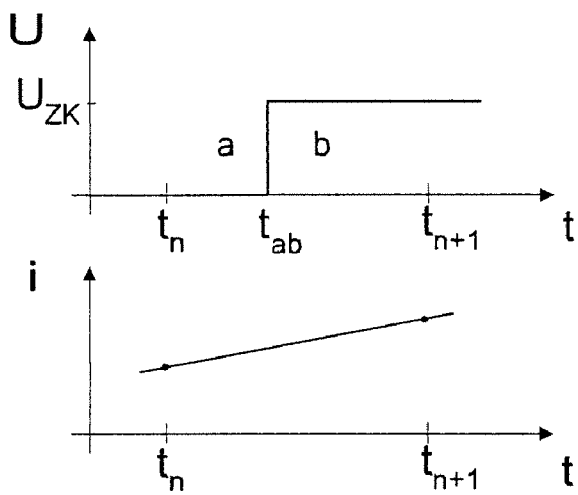
FIG. 9 diagrams with time history of current, voltage and power in accordance with a second combination case of classifications.

The second class, as can be recognized in FIG. 9, is defined by a switching operation (a→b). The work $W_n$ is determined as the sum of the trapezes over the parts of the interval width by:

$$W_n = 1/2 \cdot ((i(t_n)+i(t_{ab})) \cdot |U_{ZK}| \cdot (t_{ab}-t_n) \cdot k_a + 1/2 \cdot ((i(t_{ab})+i(t_{n+1})) \cdot |U_{ZK}| \cdot (t_{n+1}-t_{ab}) \cdot k_b \qquad (B)$$

with $$i(t_{ab})=i(t_n)+(i(t_{n+1})-i(t_n)) \cdot ((t_{ab}-t_n)/(t_{n+1}-t_n)) \qquad (B')$$

and with $k_a$, $k_b=-1; 0; +1$, depending on the state of the voltage in the respective section of the interval.

Figure 10:
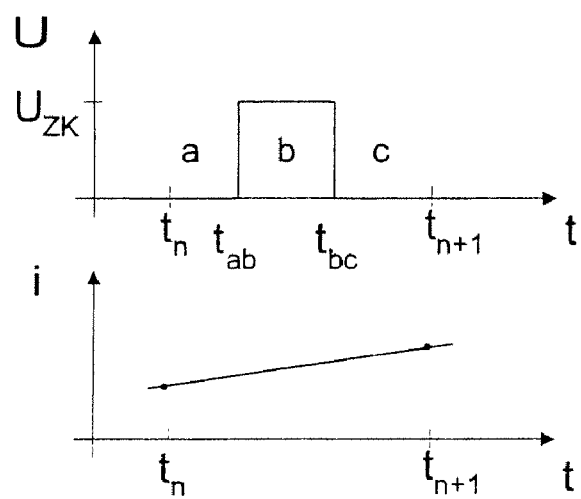
FIG. 10 diagrams with time history of current, voltage and power in accordance with a third combination case of classifications.

The third class, as can be recognized in FIG. 10, is defined by two switching operations (a→b→c). The work $W_n$ is determined as the sum of the trapezes over the parts of the interval width by:

$$W_n = 1/2 \cdot ((i(t_n)+i(t_{ab})) \cdot |U_{ZK}| \cdot (t_{ab}-t_n) \cdot k_a + \\ 1/2 \cdot ((i(t_{bc})+i(t_{ab})) \cdot |U_{ZK}| \cdot (t_{bc}-t_{ab}) \cdot k_b + \\ 1/2 \cdot ((i(t_{n+1})+i(t_{ab})) \cdot |U_{ZK}| \cdot (t_{n+1}-t_{bc}) \cdot k_c \qquad (C)$$

with $$i(t_{ab})=i(t_n)+(i(t_{n+1})-i(t_n)) \cdot ((t_{ab}-t_n)/(t_{n+1}-t_n)) \qquad (C')$$

and $$i(t_{bc})=i(t_n)+(i(t_{n+1})-i(t_n)) \cdot ((t_{bc}-t_n)/(t_{n+1}-t_n)) \qquad (C'')$$

and with $k_a$, $k_b$, $k_c=-1; 0; +1$, depending on the state of the voltage in the respective section of the interval.

As already mentioned above the power itself can easily determined from the work determined by referring to the interval length (division of the work value in the respective interval by the interval period). Through the reduction of the number of cases in accordance with the second example (formulas A-C) an easier and more rapid classification can be achieved. With this the determination of the power can also be better and more rapidly realized. Naturally one can also use a comparable solution with a spline in place of the linear interpolation, in place of the trapezes then differently shaped surfaces are to be integrated in the respective interval and multiplied by the voltage and the value k.

With the two explained methods the power in the respective intervals can be determined very easily and with sufficiently high precision and if necessary—directly or as work with subsequent division by the sum of the times—be totaled up over several intervals in order to use this for example as the basis for power controlled methods or the like.

Figure 11:
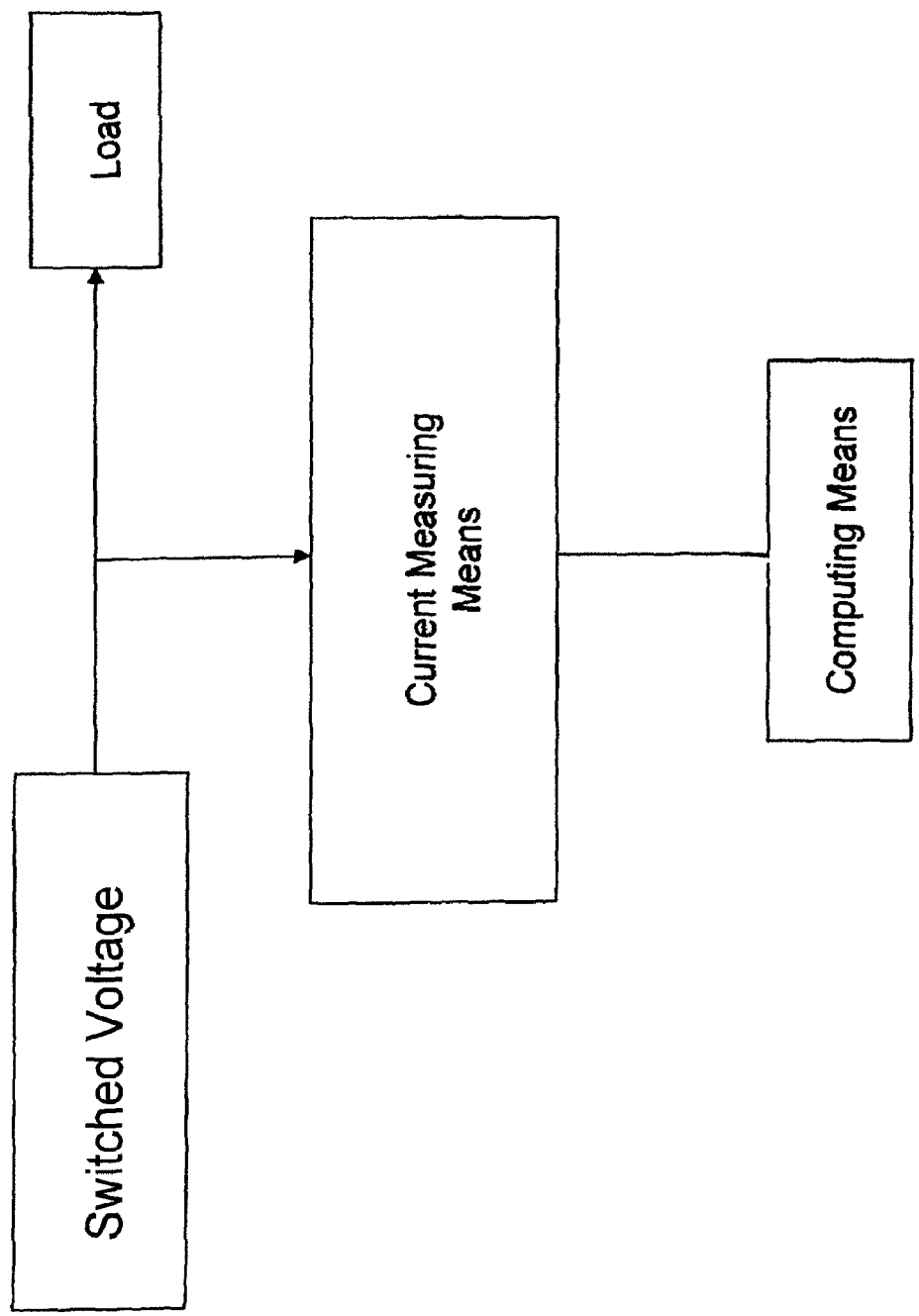
FIG. 11 is a block diagram of a exemplary embodiment in accordance with the present disclosure.

FIG. 11 illustrates an exemplary embodiment for performing the method in accordance with one form of the present invention. A switched voltage connected to a load is further connected to a current measuring means that in turn is connected to a computing means such as a clocked computer.

The invention claimed is:

1. A method for the determination of the electrical work in systems in which the voltage is switched, comprising:
   measuring current values at preset times by a current measuring means;
   interpolating the current values between the measurements using a computing means;
   providing the switched voltage for performing a classification of each interpolated current path; and
   then, through the computing means, multiplying or integrating the current value between the preset times respectively by the voltage value or values for the determination of electrical work.

2. The method according to claim 1, wherein the voltage is switched between discrete values at irregular times.

3. The method according to claim 2, wherein the voltage is switched between zero and a positive as well as a negative value of the same amount.

4. The method according to claim 3, wherein switching times and values of the voltage are measured.

5. The method according to claim 3, wherein switching times and values from a controller of the system are known.

6. The method according to claim 3, wherein the preset times for measurement of current are clocked in a tightly preset time interval.

7. The method according to claim 2, wherein switching times and values of the voltage are measured.

8. The method according to claim 2, wherein switching times and values from a controller of the system are known.

9. The method according to claim 2, wherein the preset times for measurement of current are clocked in a tightly preset time interval.

10. The method according to claim 1, wherein switching times and values of the voltage are measured.

11. The method according to claim 10, wherein switching times and values from a controller of the system are known.

12. The method according to claim 10, wherein the preset times for measurement of current are clocked in a tightly preset time interval.

13. The method according to claim 1, wherein switching times and values from a controller of the system are known.

14. The method according to claim 13, wherein the controller is a pulse width modulated controller.

15. The method according to claim 1, wherein the preset times for measurement of current are clocked in a tightly preset time interval.

16. The method according to claim 1, wherein the interpolation of the current values between measurements takes place in a linear manner.

17. The method according to claim 1, wherein the interpolation of the current values between measurements takes place with an approximation polynomial.

18. The method according to claim 17, wherein an approximation polynomial of the third order is used.

19. The method according to claim 1, wherein the classification takes place respectively with the help of the number and/or direction of switching operations of the voltage between the measured current values.

20. The method according to claim 1, wherein the determination of the work takes place via a clocked computer.

21. A method for the determination of the electrical power in systems in which the voltage is switched, wherein first the electrical work is determined according to claim 1, and from this determination then determining the power reference to the period of time between the measurements.

* * * * *